United States Patent [19]

McLaury

[11] Patent Number: 5,265,050

[45] Date of Patent: Nov. 23, 1993

[54] INTEGRATED CIRCUIT MEMORY WITH ISOLATION OF COLUMN LINE PORTIONS THROUGH P-SENSE AMPLIFICATION PERIOD

[75] Inventor: Loren L. McLaury, Boise, Id.

[73] Assignee: Micron Technology, Inc., Boise, Id.

[21] Appl. No.: 931,929

[22] Filed: Aug. 18, 1992

[51] Int. Cl.$^5$ .............................................. G11C 11/40
[52] U.S. Cl. ............................. 365/189.01; 365/203; 365/230.06
[58] Field of Search .............. 365/189.01, 182, 230.01, 365/230.03, 230.06, 203

[56] References Cited

U.S. PATENT DOCUMENTS

| | | | |
|---|---|---|---|
| 4,636,987 | 1/1987 | Norwood et al. | 365/208 |
| 4,748,349 | 5/1988 | McAlexander et al. | 307/530 |
| 5,103,113 | 4/1992 | Inui et al. | 365/203 |

*Primary Examiner*—Terrell W. Fears
*Attorney, Agent, or Firm*—Dorr, Carson, Sloan & Peterson

[57] ABSTRACT

A DRAM or VRAM integrated circuit memory of the divided bit line design includes a bit line pair extending from a column decoder to a SAM. An N-sense amplifier divides the bit line pair into two pairs of bit line halves. The N-sense amplifier is connected to each of the bit line halves through an isolation transistor. A P-sense amplifier is connected across each pair of the bit line halves. The timing signals enabling and disabling the isolation transistors and the P-sense amplifiers are designed so that during an access of the bit line halves nearest the data port, the isolation of the N-sense amplifier and the associated P-sense amplifier from the bit line halves distal from the data port is extended through the P-sense amplifier cycle and into the precharge cycle, thereby charging only the bit line halves nearest the port and saving power. In another embodiment, a single P-sense amplifier is connected across the bit line pair adjacent the N-sense amplifier between the isolation transistors, with the same isolation timing and power saving results.

22 Claims, 6 Drawing Sheets

DRAM ACCESS CYCLE

*Fig. 4*
*(Prior Art)*

DRAM ACCESS CYCLE

*Fig. 5*

REFRESH CYCLE

Fig. 6

VRAM ACCESS CYCLE

INTEGRATED CIRCUIT MEMORY WITH ISOLATION OF COLUMN LINE PORTIONS THROUGH P-SENSE AMPLIFICATION PERIOD

BACKGROUND OF THE INVENTION

1. Field of the Invention

The invention in general relates to integrated circuit memories and more particularly with such memories in which two or more portions of the bit lines are isolated from one another during an access cycle to improve performance.

2. Statement of the Problem

Integrated circuit memories generally contain a two dimensional array of storage cells arranged in rows and columns. A common architecture is to connect all cells in a row to a common row line, often referred to as the "word line" and all cells in a column to a common column line often called the "bit line" or "digit line". In this architecture, the row line provides a signal which enables cells to receive or output a data signal and the column line provides the input or output line on which the signal is transferred. An individual cell is addressed via a row decoder that selects a row to be addressed and a column decoder which selects a column to be addressed, thereby selecting one particular cell at the corresponding row and column location. The cell is accessed by placing an enable signal on the row line in the row associated with the cell and reading or writing a signal on the column line associated with the cell.

Integrated circuit memories are also generally binary logic circuits in which information is stored and transferred as voltages representing complementary logic values that are alternately referred to as "true and false", "logic 1 and logic 0", or "logic high and logic low". Typically a voltage of 5 volts may represent the logic 1 state while a voltage of zero volts represents the logic 0 state. Because of the constraints of resistance, capacitance etc. the individual voltages input to or output on the column lines by individual cells are usually at some intermediate voltage. Thus subcircuits are associated with the column lines of integrated circuit memories to pull the high voltage values up to, or as close as possible to, the full logic 1 voltage, for example 5 volts, and to pull the low voltages down to as close to the logic 0 voltage, for example 0 volts, as possible. These subcircuits are commonly referred to as sense amplifiers. A common architecture utilizes a separate pull down subcircuit, referred to as an N-sense amplifier, to pull the low signals down to the logic 0 voltage, and a separate pull up subcircuit, referred to as a P-sense amplifier, to pull the high voltages up to the logic 1 voltage.

The invention to be disclosed herein is particularly applicable to an architecture used in dynamic random access memories (DRAM) and video random access memories (VRAM). In this architecture the individual memory cell comprises a transistor and a capacitor connected in series. One side of the capacitor is connected to a reference voltage, and the other side is connected to the column line through the transistor. The gate of the transistor is connected to the row line. Information is stored in the form of charge on the capacitor, which charge is input and output via the column line and gated by the row line acting on the transistor gate. There are tens or even hundreds of such cells connected to each column line. The column lines are organized into pairs with one N-sense amplifier and one P-sense amplifier associated with each pair. The N-sense amplifiers and P-sense amplifiers are connected across the pairs, with one column line going low and the other going high when one of the pairs of lines is addressed. The attachment of the transistor gates to row lines is staggered with the cells associated with adjacent pairs of column lines belonging to different rows so that the transistor which gates one of each associated pair will be off when a cell on the other of the pair is being addressed. That is, when a particular cell is addressed, the column line it is attached to will go high or low, depending on the cells content; the other column line or the pair will go to the opposite logic value. When the read or write cycle is over, the pairs are shorted together, which quickly brings them to a mid-voltage level, resetting them for the next cycle. In this way the pairing of the lines results in faster cycling of the circuit as a whole. Since the connection of the cells to the row lines are staggered, the transistor gates associated with the one of the line pair that is not being addressed are always off and the information in the cells is not affected by the column line of the non-addressed cells going high or low. This architecture is referred to as "divided bit line sensing". A common arrangement of the various parts of the circuit in the divided bit line sensing approach is to locate the column decoder and DRAM input and output terminals at one end of the column lines, the P-sense amplifiers at the other end of the column lines, and the N-sense amplifiers at the center of the column lines thereby dividing each the column lines into two halves, one half of the line extending between the N-sense amplifier and the column decoder and the other half extending between the N-sense amplifier and the P-sense amplifier. In VRAM there is also a sequential-access memory (SAM) port connected to the column lines on the side of the P-sense amplifier opposite the column decoder.

As is well-known, integrated circuit memories are generally mass produced by fabricating hundreds of identical circuit patterns on a single semiconducting wafer, which wafer is subsequently sawed into hundreds of identical dies or chips. The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, the smaller the size of the individual cell, the smaller the size of the individual electrical components in the cell, and the smaller the electrical signals associated with them. As more and more individual storage cells are paced unto a single chip, the length of the column lines connecting the individual cells to the amplifiers becomes longer and longer as compared to the individual cell size, and the capacitance associated with the lines becomes larger. This means that the signal transferred to the column line from an individual cell will become even smaller as the capacitance of the line absorbs the charge, and further that the time for developing a useful signal level on the line will increase. As is well known, speed is an important factor in such memories, since the faster the cells can be read, the faster is the computer of which the memory is a part, and the more operations the computer can do. Thus a number of enhancements have been made to DRAM and VRAM architecture to increase the signal level and amplifier response time. Several such enhancements are described in U.S. Pat. Nos. 4,748,349 and 4,636,987. The former patent describes a circuit which boosts the voltage on the row line and thus the gate of the gating transistors to a value above the high logic voltage of the circuit. This permits the full high logic voltage to be placed on the cell capacitor, since the threshold voltage drop across the gating transistor is eliminated. The latter patent describes an architecture in which each N-Sense amplifier is connected to each of the four column line pair halves associated with it through an isolation transistor. The gates of the isolation transistors are connected to a timing signal which isolates the N-sense amplifier from the column line pair halves on the opposite side of the N-sense amplifier from the row that is being addressed. That is, when the row being addressed is on, say, the left side of the N-sense amplifier, the isolating transistors connecting the N-sense amplifier to the left halves of the column line pair are on while the isolating transistors on connecting the N-sense amplifier to the halves on the right side of the N-sense amplifier are off. Thus the N-sense amplifier is connected to only half of the full column line during the time the N-sense amplifier signal is developing, which doubles the signal that the addressed cell develops at the N-sense amplifier. However, this architecture creates several disadvantages. First, for the cells on the opposite side of the N-sense amplifier from the P-sense amplifier, i.e. cells between the N-sense amplifier and the column decoder, the voltage developed at the P-sense amplifier must pull through the two isolation transistors, thus the voltage for these accesses can never be pulled to the full logic 1 voltage, but is down $V_T$, the threshold voltage of the isolation transistors. This also results in a significantly lower voltage developed by the P-sense amplifier in half of the accesses Which either requires more stringent specifications in design and fabrication, and/or results in more defects and less reliability. Further, in order to prevent the voltage drop $V_T$ from being too large, the isolation transistors have to be natural threshold N-channel transistors. Since all the transistors in the DRAM or VRAM integrated circuit except these are high impedance transistors, this architecture requires an additional mask step in fabrication process, i.e. a natural threshold transistor mask step. Thus there is a need for a memory architecture that allows the full logic one voltage to be developed on both pairs of column line halves, allows the use of high impedance isolation transistors, and/or provides a more balanced voltage throughout the access cycle.

For many applications of integrated circuit memories, such as for portable computers and other battery powered intelligent devices, the amount of power available is limited. Thus it is important that sense amplifiers not only are fast and small, but also consume a minimum of power. The largest component of the total power used in DRAM's is the charging and discharging of the column lines. Since all bits on the selected row line during an access must be refreshed, all the column lines must be charged or discharged. In the prior art, the entire column line had to be charged or discharged in every access. Therefore there is a need for an integrated circuit memory design in which this charging and discharging of digit lines is limited. In sum, it would be highly desirable to have an integrated circuit memory architecture that not only increases the voltage developed at the N-sense amplifiers, increases the voltage developed by the P-sense amplifiers, provides a more balanced voltage curve throughout all accesses, and permits high impedance N-sense amplifier isolation transistors, but also decreases the power consumed by the memory circuit.

3. Solution to the Problem

The present invention solves the above problems by providing an improved P-sense amplifier architecture and, during an access of the column line halves nearest the data port, extends the isolation of the amplifier from the column line halves distal from the data port through the P-sense amplifier cycle. In the preferred embodiment the isolation is extended into the precharge cycle.

In one embodiment the invention employs two P-sense amplifiers per column line pair in the memory architecture. One P-sense amplifier is associated with each pair of column line halves. Preferably, one P-sense amplifier is located at the SAM end of the column line pair and another P-sense amplifier is located at the column decoder end of the column line pair.

More specifically, in DRAM, when the row being addressed is on the column decoder side of the N-sense amplifier, the isolation transistors on the SAM side of the N-sense amplifier remain off during both the N-sense and P-sense phases of the cycle, while in VRAM modes such as transfers and flash writes when the row being addressed is on the SAM side of the N-sense amplifier, the isolation transistors on the column decoder side of the N-sense amplifier remain off during both the N-sense and P-sense periods. During the refresh cycle, the isolation transistors on the opposite side of the N-sense amplifier from the row being addressed remains off during both the N-sense and P-sense periods.

Further, the actuation of the individual P-sense amplifiers is controlled by a timing signal so that the P-sense amplifiers associated with the column line pair halves that are isolated from the inputs/outputs during the P-sense cycle do not fire, thus not charging the associated column line halves and saving power.

Since, in this P-sense architecture the invention provides independent control of the high voltage on both sides of the N-sense amplifier, both halves of the column lines can be charged all the way to the full logic 1 voltage. This full voltage can then be written to all the storage cells, on both sides of the sense amplifier, providing substantially improved performance over the previous art.

In another embodiment, there is just one P-sense amplifier associated with each column line pair, but it is located adjacent the N-sense amplifier between the isolation transistors. With the isolation transistor timing described above, this architecture also results in the same power savings. It also provides a more balanced voltage throughout the cycle.

SUMMARY OF THE INVENTION

The invention provides an integrated circuit memory comprising: an array of memory cells arranged in a plurality of rows and at least one column; a plurality of row lines, each row line connecting cells in a row; row decoder means for addressing one of the rows in response to a row address signal; a column line connecting cells in a column, the column line divided into a first portion and a second portion; timing signal generator means for providing a P-sense timing signal defining a P-sense period and an isolation timing signal defining an isolation period which begins prior to the beginning of the P-sense period and extends into the P-sense period, the isolation timing signal being related to whether the row being addressed by the row decoder means is connected to a cell connected to the first column line portion or a cell connected to the second column line portion; P-sense amplifier means connected to the column line and responsive to the P-sense timing signal for amplifying the signal on the column line during the P-sense period; and isolating means responsive to the isolation timing signal for isolating the first column line portion from the second column line portion and the P-sense amplifier means during the isolation period while a row line associated with the second column line portion is being addressed. Preferably, the integrated circuit memory further comprises input/output means for connecting the second column line portion to a circuit external of the memory array and: the P-sense timing signal comprises a first P-sense timing signal defining a first P-sense period and a second P-sense timing signal defining a second P-sense period; the P-sense sense amplifier means comprises first P-sense amplifier means connected to the first column line portion and responsive to the first P-sense timing signal for amplifying the signal on the first column line portion during the first P-sense period and second P-sense amplifier means connected to the second column line portion and responsive to the P-sense timing signal for amplifying the signal on the second column line portion during the second P-sense period; and the isolating means comprises first isolating means responsive to the isolation timing signal for isolating the first column line portion from the second column line portion and the second P-sense amplifier means during the first P-sense period while a row line associated with the second column line portion is being addressed. Preferably, the P-sense timing signal comprises a first P-sense timing signal defining a first P-sense period and a second P-sense timing signal defining a second P-sense period; the timing signal generator means further comprises means for providing a refresh timing signal defining a refresh period; and the isolating means comprises first isolating means responsive to the isolation timing signal for isolating the first column line portion from the second column line portion and the P-sense amplifier means during the second P-sense period while a row line associated with the second column line portion is being addressed during the refresh period, and second isolating means responsive to the isolation timing signal for isolating the second column line portion from the first column line portion and the P-sense amplifier means during the first P-sense period while a row line associated with the first column line portion is being addressed during the refresh period. Preferably, the integrated circuit memory further comprises an N-sense amplifier connected to the column line between the first isolating means and the second isolating means and wherein the P-sense amplifier means comprises first P-sense amplifier means connected to the first column line portion and responsive to the first P-sense timing signal for amplifying the signal on the first column line portion during the first P-sense period, and second P-sense amplifier means connected to the second column line portion and responsive to the second P-sense timing signal for amplifying the signal on the second column line portion during the second P-sense period. Preferably, the timing signal generator means further comprises means for producing a row access signal which changes during the P-sense period, and the isolation period continues at least until the row access signal changes during the P-sense period. Preferably, the timing signal generator means further comprises means for producing a signal defining a precharge period, and the isolation period continues at least until the precharge period. Preferably, the isolation period extends into the precharge period. Preferably, the integrated circuit memory further comprises an N-sense amplifier, and: the timing signal generator means further comprises means for providing an N-sense timing signal defining a N-sense period; the isolating means comprises first isolating means responsive to the isolation timing signal for isolating the first column line portion from the second column line portion, the N-sense amplifier, and the P-sense amplifier means during the P-sense period while a row line associated with the second column line portion is being addressed, and second isolating means responsive to the isolation timing signal for isolating the second column line portion from the first column line portion and the N-sense amplifier during the N-sense amplifier period while a row line associated with the first column line portion is being addressed; and the N-sense amplifier is connected to the column line between the first isolating means and the second isolating means. Preferably, the P-sense amplifier means comprises a P-sense amplifier connected to the column line between the first isolating means and the second isolating means. Preferably, there are a plurality of the column lines, each column line is divided into a first portion and a second portion, and each column line has associated with it one of the N-sense amplifiers, one of the first isolating means, one of the second isolating means, and one of the P-sense amplifiers.

In another aspect the invention provides an integrated circuit memory comprising: an array of memory cells arranged in a plurality of rows and columns; a plurality of row lines, each row line connecting cells in a row; row decoder means for addressing one of said rows in response to a row address signal; a first column line pair comprising a first column line connecting cells in one column and a second column line connecting cells in an adjacent column, said first column line pair divided into a first pair of column line halves and a second pair of column line halves; timing signal generator means for providing a P-sense timing signal defining a P-sense period and an isolation timing signal related to whether the row being addressed by said row decoder means is connected to a cell connected to said first pair of column line halves or a cell connected to said second pair of column line halves; P-sense amplifier means connected between said column line pair and responsive to said P-sense timing signal for amplifying the signal on said column line pair during said P-sense period; and isolating means responsive to said isolation timing signal for isolating said first pair of column line halves from said second pair of column line halves and said P-sense amplifier means during said P-sense period while a row line associated with said second pair of column line halves is being addressed. Preferably, the integrated circuit memory further comprises DRAM input/output means for connecting said second pair of column line halves to a circuit external of said memory array and wherein: said P-sense timing signal comprises a first P-sense timing signal defining a first P-sense period and a second P-sense timing signal defining a second P-sense period; said P-sense amplifier means comprises first P-sense amplifier means connected to said first pair of column line halves and responsive to said first P-sense timing signal for amplifying the signal on said first pair of column line halves during said first P-sense period and second P-sense amplifier means connected to said second pair of column line halves and responsive to said P-sense timing signal for amplifying the signal on said second pair of column line halves during said second P-sense period; said isolating means comprises first isolating means responsive to said isolation timing signal for isolating said first pair of column line halves from said second pair of column line halves and said second P-sense amp means during said first P-sense period while a row line associated with said second pair of column line halves is being addressed. Alternatively, the integrated circuit memory also comprises VRAM input/output means for connecting said first pair of column line halves to a circuit external of said memory array and wherein said isolating means further comprises second isolating means responsive to said isolation timing signal for isolating said second pair of column line halves from said first pair of column line halves and said first P-sense amp means during said first P-sense period while a row line associated with said first column line portion is being addressed. Preferably, said timing signal generator means further comprises means for providing a refresh timing signal defining a refresh period; said first isolating means comprises means responsive to said isolation timing signal for isolating said first pair of column line halves from said second pair of column line halves and said second P-sense amplifier means during said second P-sense period while a row line associated with said second pair of column line halves is being addressed during said refresh period; and said second isolating means comprises means responsive to said isolation timing signal for isolating said second pair of column line halves from said first pair column line halves and said first P-sense amplifier means during said first P-sense period while a row line associated with said first pair of column line halves is being addressed during said refresh period. Preferably, the integrated circuit memory further comprises an N-sense amplifier connected across said column line pair between said first isolating means and said second isolating means. Preferably, there are a plurality of said column line pairs, each column line pair is divided into a first pair of column line halves and a second pair of column line halves, and each column line pair has associated with it one of said N-sense amplifiers, one of said first isolating means, one of said second isolating means, one of said first P-sense amplifier means, and one of said second P-sense amplifier means. Alternatively, said timing signal generator means further comprises means for providing an N-sense timing signal defining a N-sense period; said isolating means comprises first isolating means responsive to said isolation timing signal for isolating said first pair of column line halves from said second pair of column line halves, said N-sense amplifier, and said P-sense amplifier means during said P-sense period while a row line associated with said second pair of column line halves is being addressed, and second isolating means responsive to said isolation timing signal for isolating said second pair of column line halves from said first pair of column line halves and said N-sense amplifier during said N-sense amplifier period while a row line associated with said first pair of column line halves is being addressed; said N-sense amplifier is connected to said column line pair between said first isolating means and said second isolating means; and said P-sense amplifier means comprises a P-sense amplifier connected to said column line pair between said first isolating means and said second isolating means.

In still a further aspect the invention provides an integrated circuit memory comprising: an array of memory cells arranged in a plurality of rows and at least one column; a plurality of row lines, each row line connecting cells in a row; row decoder means for addressing one of the rows in response to a row address signal; a column line connecting cells in a column, the column line divided into a first portion and a second portion; an amplifier; timing signal generator means for providing a row access signal which changes near the beginning of an access cycle accessing one or more of the cells and then returns to its original value later in the access cycle, and amplifier signal defining an amplifying period, and an isolation timing signal defining an isolation period, the isolation timing signal being related to whether the row being addressed by the row decoder means is connected to a cell connected to the first column line portion or a cell connected to the second column line portion, and the isolation period beginning prior to the amplifying period and continuing at least until the row access signal returns to its original value; and isolating means responsive to the isolation timing signal for isolating the first column line portion from the second column line portion and the amplifier during the isolation period while a row line associated with the second column line portion is being addressed. Preferably, the timing signal generator means further comprises means for producing a signal defining a precharge period, and the isolation period continues at least until the precharge period. Preferably, the isolation period extends into the precharge period.

The invention not only provides an integrated circuit memory that saves power and either allows the full logic 1 voltage to be applied to all cell or provides a more balanced voltage throughout the access cycles, but it also provides faster separation of the voltage on the column line pairs resulting in less crossing current, and further power savings. Numerous other features, objects and advantages of the invention will become apparent from the following description when read in conjunction with the accompanying drawings.

DESCRIPTION OF THE PREFERRED EMBODIMENT

1. Overview

Figure 1:
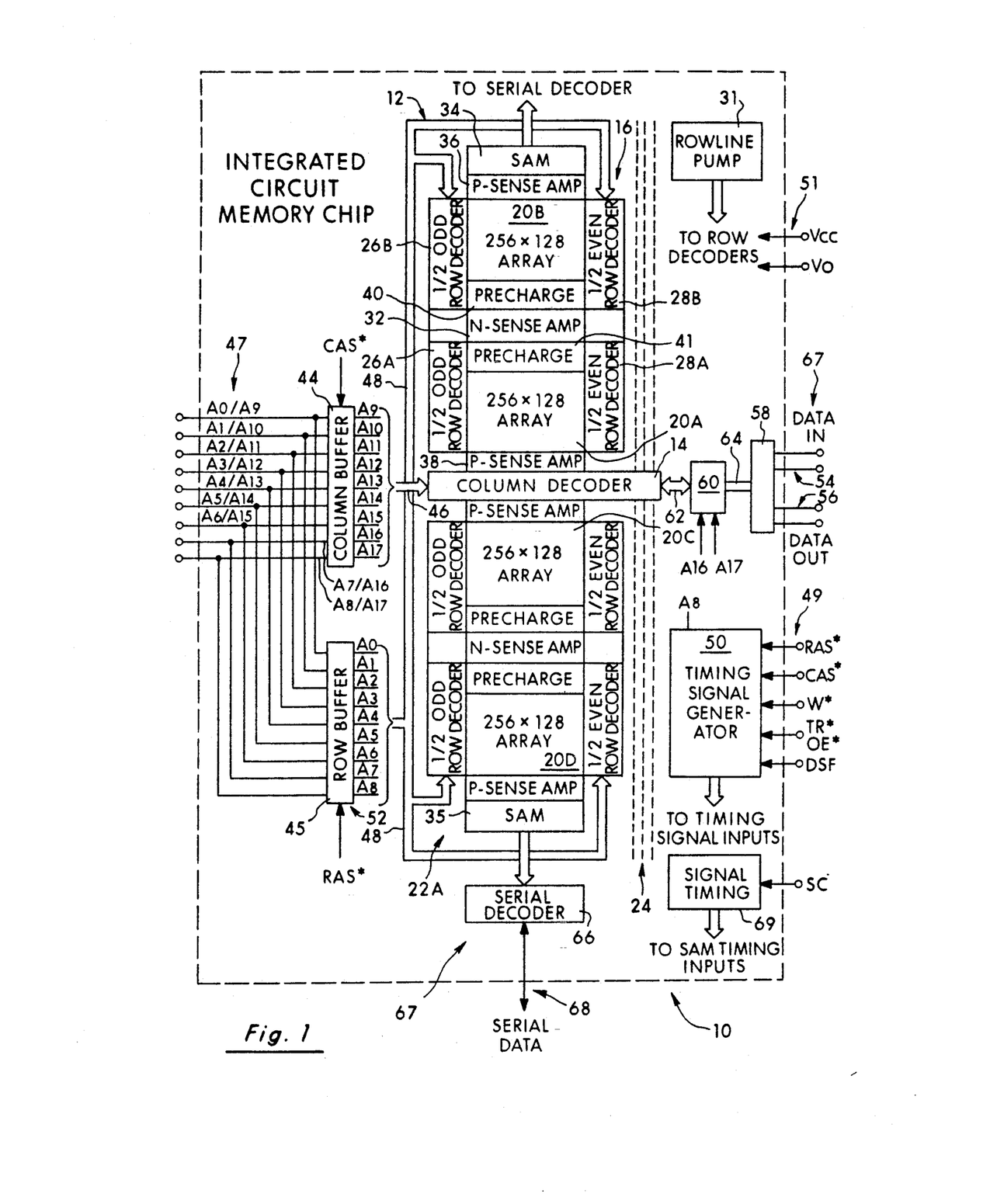
FIG. 1 is a block circuit schematic of an 512K integrated circuit memory according to a preferred embodiment of the invention.
Figure 2:
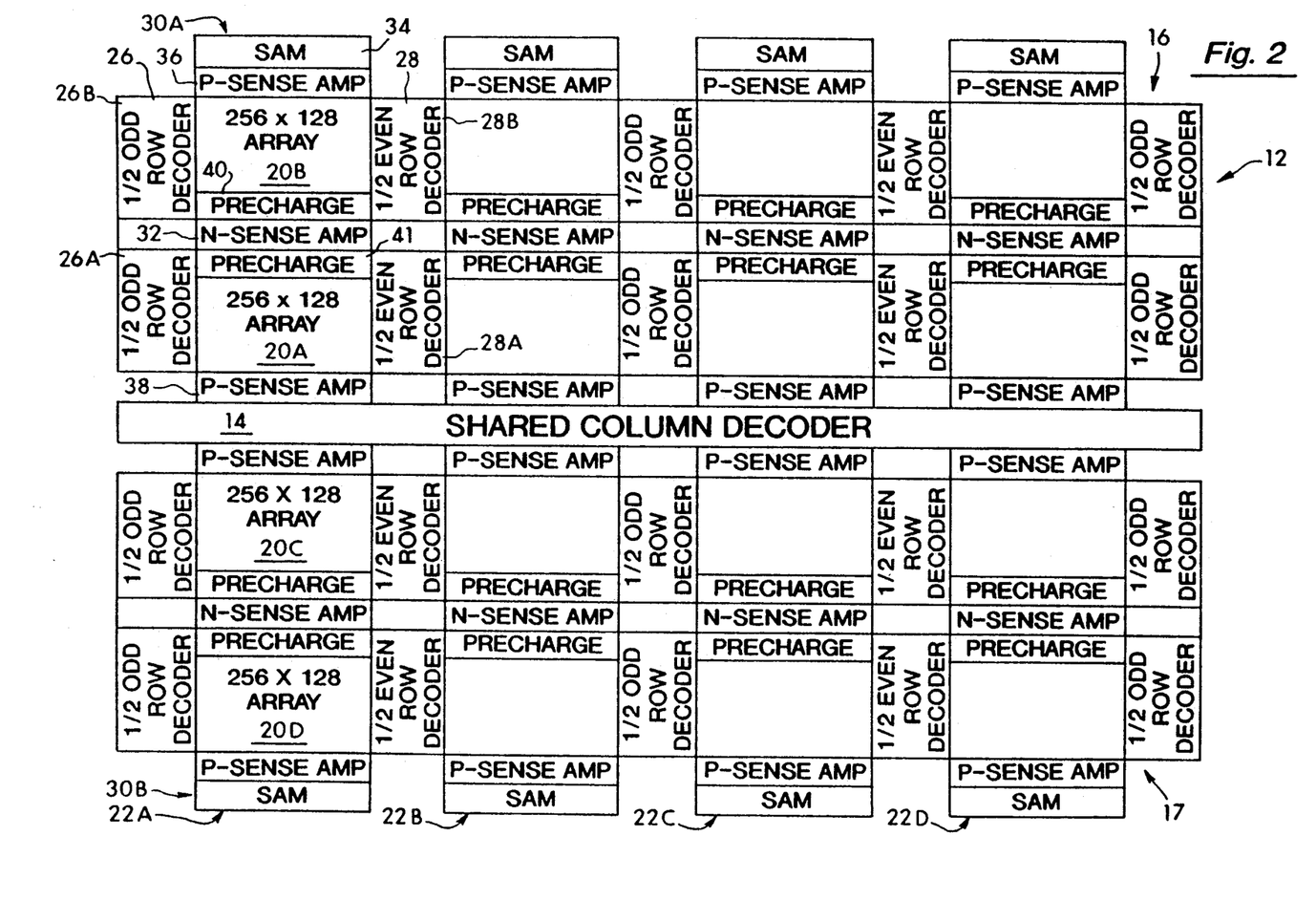
FIG. 2 is a block diagram illustrating the full array of the embodiment of FIG. 1.

Turning now to FIG. 1, there is shown an integrated circuit memory chip 10 according to the preferred embodiment of the invention. It should be understood that the particular embodiments described herein are exemplary, and are described in detail to more clearly and fully depict the invention than would otherwise be possible; they are not meant to limit the invention to these particular embodiments. The integrated circuit 10 comprises a memory circuit 12 which includes a column decoder 14, a row decoder 16, and a 1024×512 array 17 (FIG. 2) of memory cells 18 (FIG. 3), which array 17 is broken down into sixteen 256×128 smaller arrays 20. Because of space limitations, only one quadrant 22A including four arrays 20A, 20B, 20C, and 20D are shown in FIG. 1; three other quadrants 22B, 22C, and 22D (FIG. 2) are indicated by the three dotted lines 24 in FIG. 1. The full memory circuit 12 including sixteen arrays 20A, 20B, etc. is shown in FIG. 2. The full circuit 12 can be understood most easily if thought of as eight 512×128 arrays 30A, 30B, etc. each of which includes two 256×128 arrays, such as 20A and 20B, an odd row decoder 26 which is separated into two halves 26A and 26B, an even row decoder 28 which is separated into two halves 28A and 28B, an N-sense amplifier region 32, a column decoder 14 at one end, a SAM (sequential-access memory) region 34 at the other end, two P-sense amplifier regions 36 and 38, and two precharge circuit regions 40 and 41. Each of these 512×128 arrays 30A, 30B, etc. may also include other subcircuits, but these shall not be described as they are not directly related to the invention to be described. This particular embodiment selected to describe the invention is what is commonly known as a 512 Kbit memory circuit in a 256K×2 architecture. As is well known in the art, a 512 Kbit circuit actually has capacity for 524,288 bits which is equal to the 512×1024 cells.

The integrated circuit 10 is an 22 pin chip. Nine of the pins, indicated at 47, connect to the address buffers 44 and 45 which in a known manner use the CAS* and RAS* timing signals respectively to multiplex the incoming signals to output the row address signals A0 to A8 on lines 48 which connect to the row decoder 16, to output the column address signals A9 through 15 on lines 46 which connect to column decoder 14, and to output the column address signals A16 and A17 to a two-of-eight decoder 60. Row access means 52, comprises the inputs 47 and row buffer 45, and provides a signal, A8, which is directed to both the row decoder 16 and the timing signal generator 50. The address signals A0 through A15 are used to access one cell in each of the eight 512×128 arrays 30A, 30B, etc. on each access cycle. The RAS*, CAS*, W*, TR*, OE*, and DSF signals are input on five of the pins, indicated at 49, to a timing signal generator means 50, while the serial clock signal, SC, is input to a serial timing signal generator 69. Note that TR* and OE* are input to the same pin, as is common practice. The timing signal generators 50 and 69 use these signals, a conventional internal clock, and conventional logic circuitry to generate the required timing signals required by chip 10. It is noted that it is possible that in some chips some signals input to the chip, such as the RAS* or CAS* signals, may pass directly to the circuitry that uses them, such as the row buffer 45 and the column buffer 44, respectively. In this case, the input pins on which these signals are input would be considered to be part of the timing signal generator means 50, 69. In other words, the term "timing signal generator means" is intended to be as broad as possible, and includes the sources of all the timing signals used on the chip. The timing signals are used by the chip circuitry, in a manner to be described in detail below. Another two of the pins, indicated by 51, are used to input the logic 1 voltage, $V_{cc}$, and the logic zero voltage, $V_0$. Another two pins 54 provide two lines of data input while two pins 56 provide two lines of data output. The final pin 68 provides the serial data connection. Parallel input 54 and output 56 are connected to input/output buffer and control circuit 58. A two-of-eight decoder 60 utilizes the A16 and A17 signals from column buffer 44 to connect two of the eight pairs of input/output lines 62 coming from column decoder 14 to the dual line 64 which connects to the input/output buffer and control circuit 58. SAM regions 34 and 35 connect to serial decoder 66 which multiplexes the SAMs to the serial input and output lines 68 and 69 respectively. The integrated circuit chip 10 also includes a row line pump circuit 31 which is essentially a large capacitor Which connects to the row decoders 16. The structure of such row line pump circuits is well-known and will not be discussed in detail herein.

The particular embodiment is what is generally known as a VRAM (Video Random Access Memory). A DRAM (Dynamic Random Access Memory) would be exactly the same except it would not include the SAM regions 34 and 35, the serial decoder 66, the serial input 68, and serial timing generator 69. In the discussion below, in order to avoid the redundancy of separate drawings for DRAM circuits, we shall sometimes refer to a DRAM cycle in reference to FIGS. 1, 2, or another figure showing one or more SAMs. In such discussions of DRAM functions, it is intended that the SAMs would not function or otherwise be ignored, and all inputs and outputs would be via column decoder 14. As will be seen below, the input/output means 67 of the invention can be considered to be either the column decoder 14 together with the lines 62, decoder 60, control circuit 58, inputs 54 and outputs 56, or the SAMs together with serial decoder 66, serial data input and output 68, or any other input/output circuits used with integrated circuit memories.

In one preferred embodiment of the invention, each of the eight 512×128 arrays 30A, 30B, etc. include two P-sense amplifier regions 36 and 38, i.e. one P-sense amplifier region 36 at the distal end of the array from the column decoder 14 adjacent SAM 36, and another P-sense amplifier region 38 adjacent the column decoder 14. Translating this to the detailed circuitry of the invention (FIG. 3), there are two P-sense amplifiers, associated with each column line pair, for example, amplifiers 36A and 38A are associated with column line pair 70 and 72. One P-sense amplifier 36A is connected across column line halves 70Ba and 70A adjacent the SAM 34A, and the other P-sense amplifier 38A is connected across column line halves 70A and 72A adjacent the column decoder 14. In another embodiment of the invention (FIG. 8), there is just one P-sense amplifier associated with each column line pair, for example P-sense amplifier 110 associated with column line pair 121 and 122. However, the single P-sense amplifier 110 is located between the pairs of isolating transistors 131A, 131B and 133A, 133B. As will be discussed below, these two novel P-sense architectures in combination with an extension of the period of isolation of the column line pairs from each other through the P-sense period, results in significant power savings and numerous other advantages, including faster separation of the logic 1 and logic 0 voltages, the ability to pull the voltage on the column lines to a higher voltage, and many other advantages.

2. The Memory Array Circuitry

Figure 3:
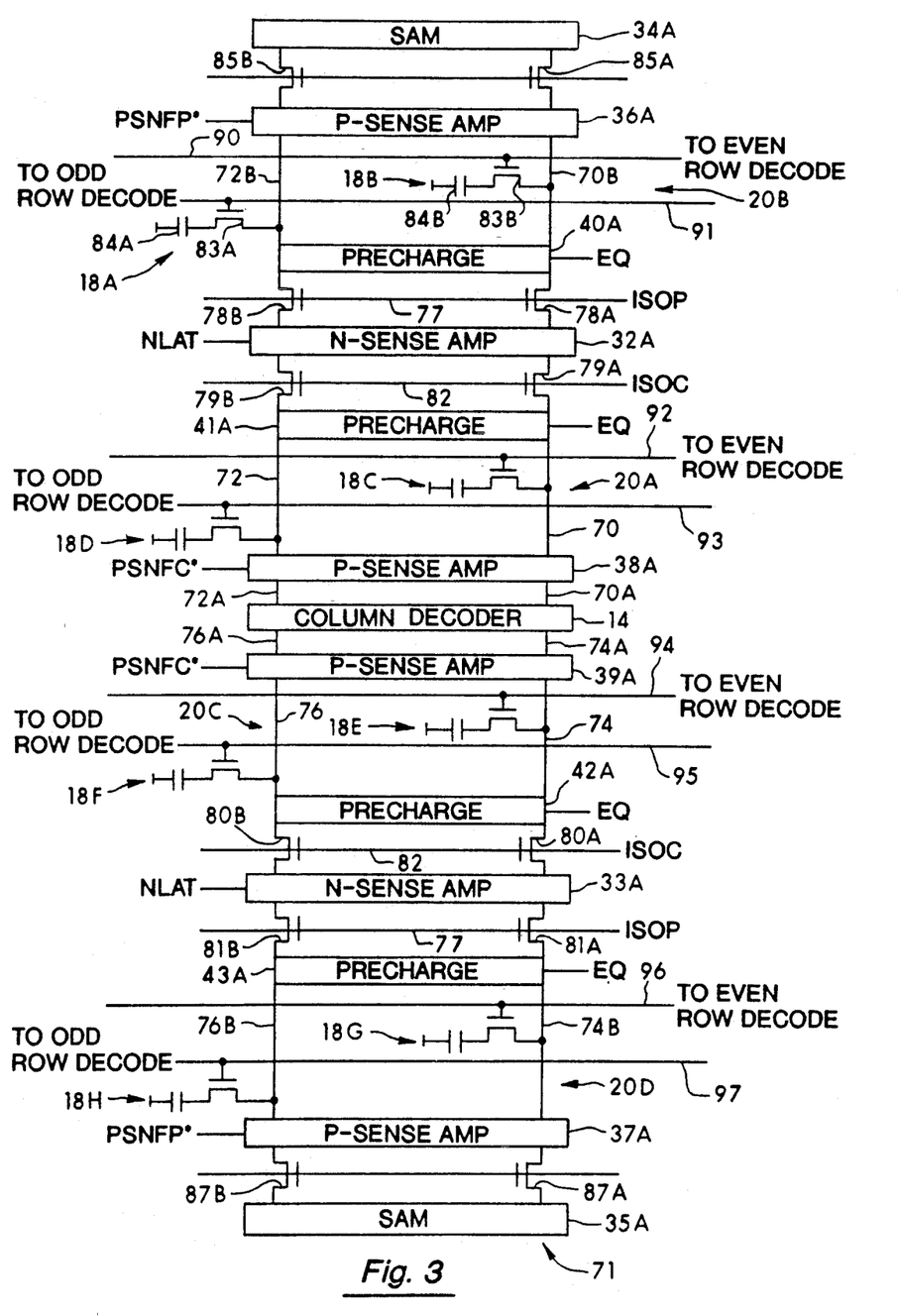
FIG. 3 is a circuit diagram illustrating the electronic architecture of one quadrant of an array according to a preferred embodiment of the invention.

FIG. 3 illustrates the circuitry of one preferred embodiment of the invention in one memory quadrant, such as 22A. The circuit 71 includes column decoder 14, N-sense amplifiers 32A and 33A, P-sense amplifiers 36A, 38A, 37A, and 39A, precharge circuits 40A, 41A, 42A and 43A, SAMs 34A and 35A, a first column line pair 70 and 72 extending from column decoder 14 to SAM 34A and a second column line pair 74 and 76 extending column decoder 14 to SAM 35A. The circuit 71 also includes isolating means 78A, 78B, 79A, 79B, 80A, 80B, 81A, and 81B, and SAM signal pass gates 85A, 85B, 87A, and 87B, all of which are n-channel transistors in the preferred embodiment. Finally the circuit 71 includes row lines 90 through 97 and memory cells 18A through 18H, each of which includes a transistor, such as 83A, and a capacitor, such as 84A. Each memory cell 18A through 18H represents 128 such cells and each row line 90 through 97 represents 128 such lines. The row line pump circuits have not been shown in FIG. 3 so as to not unduly complicate the drawing, since their design and function is well-known in the art and the invention does not alter their operation. The invention can be used with or without row line pump circuitry.

The invention can be developed most generally by considering a single column line. From such a perspective, first N-sense amplifier 32A divides column line 70 into a first column line portion 70B and a second column line portion 70A, while second N-sense amplifier 33A divides second column line 74 into a third portion 74A and a fourth portion 74B. Further a first P-sense amplifier 36A is connected to the first column line portion 70B, a second P-sense amplifier 38A is connected to the second column line portion 70A, a third P-sense amplifier is connected to the third column line portion 74A, and a fourth P-sense amplifier is connected to the fourth column line portion 74B. And so on for first, second, third and fourth isolation means 78A, 79A, 80A, and 80B respectively. However, since the preferred embodiment is designed in the divided bit line pair architecture, it is clearer to discuss the invention in terms of bit line or column line halves. In these terms, N-sense amplifier 32A divides column line pairs 70 and 72 into two pairs of column line halves, 70A and 72A being a first pair of column line halves and 70B and 72B being a second pair of column line halves. Likewise N-sense amplifier 33A divides column line pair 74 and 76 into the pair of column line halves 74A and 76A and 74B and 76B.

The circuit 71 is connected as follows. Each of 128 capacitors 84A have one side connected to a reference voltage and the other side connected to column line half 72B through its corresponding transistor 83A. The gate of each of the 128 transistors 83A is connected to one of 128 odd row lines 91. Likewise, referring to cells 18B, each of 128 capacitors 84B has one side connected to the reference voltage and the other side connected to column line half 70B through a corresponding transistor 83B, with the gate of each of 128 such transistors connected to one of 128 even row lines 90. In a like manner, 128 cells 18C are connected to column line half 70A and 128 even row lines 92, 128 Cells 18D are connected to column line half 72A and one of 128 odd row lines 93, 128 cells 84E are connected to column line half 74A and 128 even row lines 94, 128 cells 18F are connected to column line half 76A and 128 odd row lines 95, 128 cells 18G are connected to column line half 74B and 128 even row lines 96, and 128 cells 18H are connected to column line half 76B and 128 odd row lines 97. Column line half 72B is connected to SAM 34A through transistor 85B and column line half 70B is connected to SAM 34A through transistor 85A. P-sense amplifier 36A is connected across column line halves 70B and 72B, and precharge circuit 40A connects the same two column line halves. Column line half 70A is connected to N-sense amplifier 32A through isolation transistor 78A and column line half 72B is connected to N-sense amplifier 32A through isolation transistor 78B. Column line half 70A is connected to N-sense amplifier 32 through isolation transistor 79A and column line half 72A is connected to N-sense amplifier 32 through isolation transistor 79B. Precharge circuit 41 connects column line halves 70A and 72A, and P-sense amplifier 38 is connected across the same two column line halves. On the lower side of column decoder 14, P-sense amplifier 39A is connected across column line halves 74A and 76A, and precharge circuit 42A connects the same two column line halves. N-sense amplifier 33A is connected to column line halves 74A, 76A, 74B, and 76B respectively through isolation transistors 80A, 80B, 81A, and 81B respectively. Precharge circuit 43A connects column line halves 74B and 76B, and P-sense amplifier 37A is connected across the same two column line halves. Column line half 74B is connected to SAM 35A through transistor 87A, while column line half 76B is connected to SAM 35A through transistor 87B. P-sense amplifiers 36A and 37A have inputs labeled PSNFP*, which is the timing signal which enables and disables their operation. Likewise P-sense amplifiers 38A and 39A have inputs labeled PSNFC*, the timing signal which enables and disables their operation. Likewise each of the precharge circuits 40A, 41A, 42A, and 43A and each of the N-sense amplifiers 32A and 33A have inputs labeled EQ and NLAT, respectively, the timing signals that enable and disable their operation. The gates of isolation transistors 78A, 78B, 81A, and 81B are connected to the line 77 which carries the timing signal ISOP. The gates of isolation transistors 79A, 79B, 80A, and 80B are connected to the line 82 which carries the timing signal ISOC. As shown in FIG. 1, the column decoder 14 has inputs from the column buffer 44 and outputs to the output decoder 60, and the SAM has outputs to the serial decoder 66. These inputs and outputs as well as other details of the column decoder 14 and SAMs 34A and 35A are known in the art and will not be discussed in detail. The design of N-sense amplifiers 32A, and 33A, P-sense amplifiers 36A, 37A, 38A, and 39A, and precharge circuits 40A, 41A, 42A, and 43A, and row line pump circuits 31 (FIG. 1) are also known in the art and thus will not be discussed in detail herein. There are 128 circuits such as 71 in each quadrant, such as 22A. Each of the even row lines 90, 92, 94, and 96 (each representing 128 such row lines) connect to one of the 128 transistors in the cells that are connected to the right hand column line of the column line pair in each such circuit, and each of the odd row lines 91, 93, 95, and 97 (each representing 128 such row lines) connect to one of the 128 transistors in the cells that are connected to the left hand column line of the column line pair in each such circuit. With 128 such circuits 71, and with 128 cells connected to even row lines and each right hand column line half, plus 128 cells connected to odd row lines and each left hand column line half, we arrive at the 256×128 cells in each array such as 20B.

As indicated above, the circuit 71 differs from the prior art memory array circuits in that it has an additional P-sense amplifier 38A associated with the upper column line pair 70 and 72 and an additional P-sense amplifier 39A associated with the lower column line pair 74 and 76. From the description of the connection of the circuits above, several advantages of having an the additional P-sense amplifier associated with each column line pair is evident. First of all, each pair of column line halves has a P-sense amplifier acting directly on them. Thus the voltage on them will separate to logic 1 and logic 0 faster. Secondly, when column line half 70A goes high, it no longer has to be pulled up to the high logic state through a pair of transistors 78A and 79A. Rather it is pulled up to the high logic state via P-sense amplifier 38A. Thus, with the use of a word line pump circuit 31, the memory cells, such as 18C, can be pulled up to the full logic 1 voltage. Likewise for column line halves 70A, 72A, 74A, and 76A located closest to the column decoder and their associated memory cells. This also means that the voltage developed on both pairs of column line halves, 70A, 72A and 70B, 72B will be the same, resulting in a more balanced voltage curve over all accesses. Thirdly, since the circuit no longer has to pull the column line halves located closest the column decoder up through the isolating transistors 78A through 81B, these transistors no longer must be low or natural threshold transistors, but can be high threshold transistors like all the other transistors 83A, etc. in the memory circuit 12. Thus the fabrication mask step that was used to make the low threshold isolation transistors in the prior art can be eliminated.

3. The Circuit Timing and Function

Figure 4:
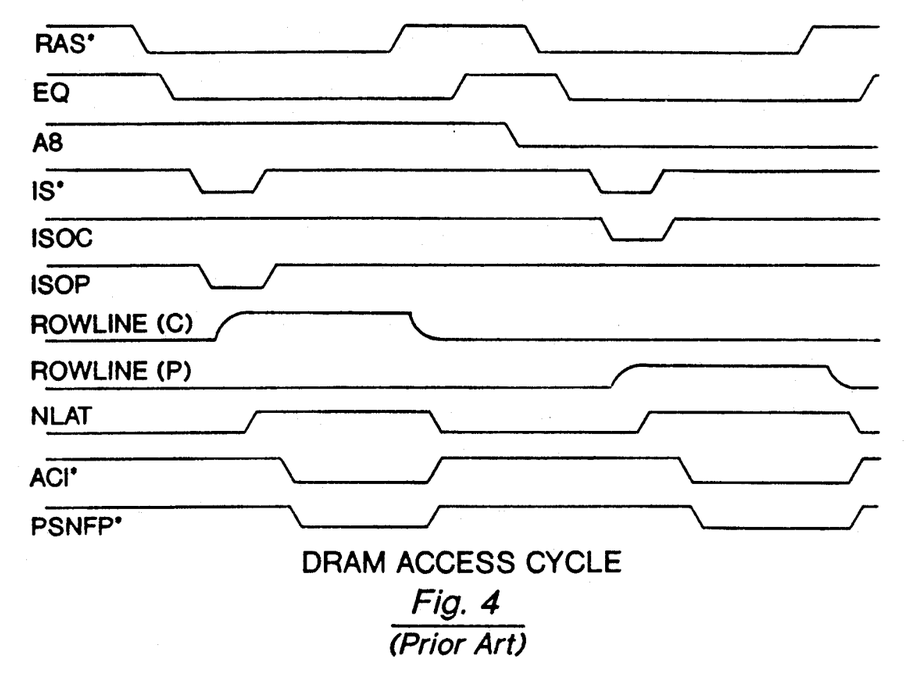
FIG. 4 is a timing diagram for a prior art DRAM showing the cycles of timing signals utilized in the array access functions.
Figure 5:
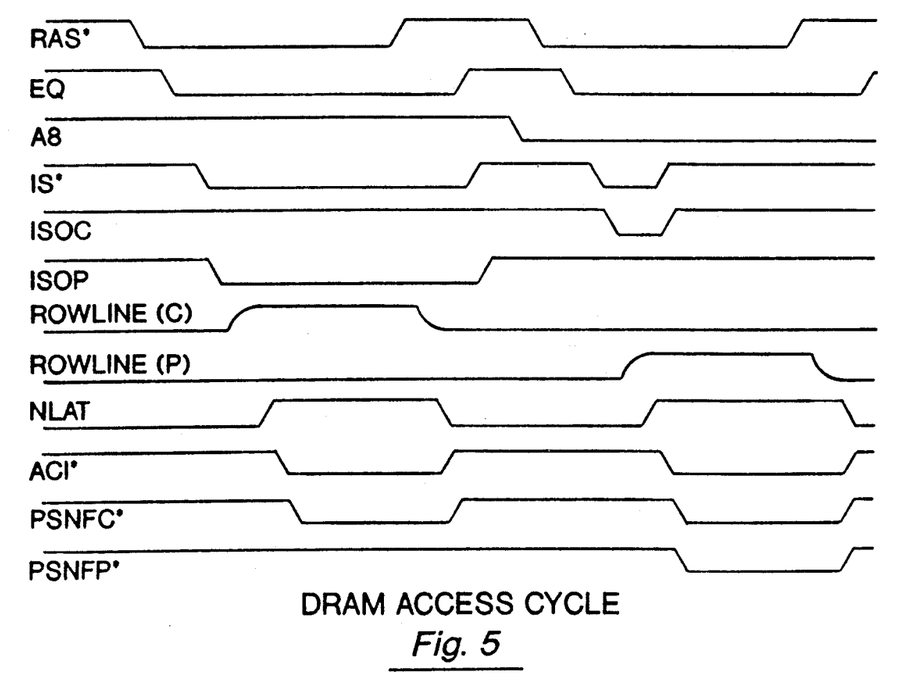
FIG. 5 is a timing diagram showing the cycles of timing signals utilized in a DRAM access for the integrated circuit of FIG. 3.

FIG. 4 is a timing diagram of the timing signals relevant to the invention for a DRAM access cycle in a prior art integrated circuit memory using only one P-sense amplifier per column line pair. FIG. 5 shows the analogous timing signals for a DRAM access cycle according to the invention. We shall first describe with reference to FIG. 5 how the circuit 71 of FIG. 3 operates for typical accesses, then compare the timing cycles of FIGS. 4 and 5 to see how the timing of the circuit according to the invention differs from the prior art. It should be understood that the timing diagrams are meant to illustrate the invention only and should not be taken as precise measurements of actual signals. Referring to FIG. 5, except as indicated below, all the signals shown are derived from RAS*; that is they are generated in timing signal generator 50 by a timing chain type circuit to produce the signals as shown. The signals shown are: RAS*, the row address signal; EQ, which enables and disables the precharge circuits; the A8 row address signal; IS*, an intermediate timing signal used in the isolation transistor timing; ISOC, a signal derived from IS* and which enables and disables the isolation transistors nearest the column decoder; ISOP, a signal derived from IS* and which enables and disables the isolation transistors farthest from the column decoder (and nearest the single P-sense amplifier in the prior art); Rowline (c), the signal which is applied to the cell transistor gates of the row addressed when A8 is high, i.e. in FIG. 3, a row in the arrays 20A and 20C closest to the column decoder; Rowline (p), the signal which is applied to the cell transistor gates of the row addressed when A8 is low, i.e. in FIG. 3, a row in the arrays 20B and 20D closest to the SAMs; NLAT, the signal that enables and disables the N-sense amplifiers and the defines the N-sense operating periods; AC1*, an intermediate signal used in the P-sense amplifier timing; PSNFC*, which enables and disables the P-sense amplifiers nearest the column decoder and thus defines their operating periods; and PSNFP*, which enables and disables the P-sense amplifiers farthest from the column decoder and thus defines their operating periods. Referring to FIGS. 3 and 5, the circuit 71 functions as follows. When an access of the memory circuit 12 is made, the RAS* signal drops which causes the row line buffer 45 to place a row address on its outputs. The architecture in the preferred embodiment of FIG. 3 is designed so that when the A8 signal is high, one row in each of the arrays 20A and 20C is addressed and when the A8 signal is low, one row in each of arrays 20B and 20D is addressed. For purposes of this discussion, we will first assume that A8 is high and the rows associated with row lines 92 and 94 are addressed. Shortly after the RAS* signal drops, the CAS* signal (not shown in FIGS. 4 and 5) drops and the column buffer 44 places a column address on its outputs. For purposes of this discussion, assume that the address of the column of circuit 71 is selected. Shortly after RAS* drops, EQ goes low which disables the precharge circuits 40A, 41A, 42A, and 43A. ISOP then goes low turning off isolation transistors 78A and 78B to isolate column line halves 70B and 72B and the P-sense amplifier 36A from the column line halves 70A and 702A, N-sense amplifier 32A, and P-sense amplifier 38A, and also turning off transistors 81A and 81B to isolate column line halves 74B and 76B and P-sense amplifier 37A from column line halves 74A and 76A, N-sense amplifier 33A, and P-sense amplifier 39A. For purposes of this discussion we will assume that the access is a DRAM read cycle and the signal stored in cell 18C is a logic 1 while the signal stored in cell 18E is a logic 0. While the transistors 78A, 78B, 81A, and 81B are turning off, row lines 92 and 94, responding to the address on lines 48 (FIG. 1), begin to go high turning on the transistors in cells 18C and 18E. This allows the signal stored on the capacitor of cell 18C to be placed on column line half 70A and the signal stored on the capacitor of cell 18E to be placed on column line half 74A. Thus the signal on column line half 70A will begin to rise and the signal on column line half 74A will begin to fall. As soon as these signals begin to develop, NLAT goes high turning on N-sense amplifiers 32A and 33A. The N-sense amplifiers drive the low side of the pair of column line halves to a logic 0, thus column line halves 72A and 74A will begin to go to logic 0. Then PSNFC* goes low turning on P-sense amplifiers 38A and 39A. The P-sense amplifiers drive the high one of the column line halves they are connected across to logic 1, or as close thereto as possible. Thus column line halves 70A and 76A are driven toward logic 1. Meanwhile, responding to the address on lines 46 (FIG. 1), column decoder 14 connects the column line pairs at the address output from column address buffer 44 to the data input/output lines 62 (FIG. 1); namely, column lines 70 and 72 are connected to one pair of input/output lines 62 (FIG. 1) and the column lines 74 and 76 are connected to another pair of the input/output lines 62, which sends the logic 1 stored in cell 18C and the logic 0 stored in cell 18E to the data output 56. Then RAS* returns high, causing row lines 92 and 94 then go low, shutting off the transistors in cells 18C and 18C so that subsequent voltages on the column line halves 70A and 74A will not affect the status of the charge on the capacitors in the respective cells, NLAT goes low and PSNFC* goes high shutting off N-sense amplifiers 32A and 33A and P-sense amplifiers 38A and 39A, respectively, then EQ goes high enabling precharge circuits 40A, 41A, 42A, and 43A which connect column line 70 to column line 72 and column line 74 to column line 76 respectively, which causes them to charge to an intermediate level between logic 1 and logic 0. Finally ISOP goes high, turning on transistors 78A, 78B, 81A, and 81B to once again connect the halves of the column lines 70, 72, 74 and 76.

Assume that the next access is also a DRAM read and A8 is low, and thus row decoder 16 addresses one row in each of arrays 20B and 20D. Also assume that the rows accessed are those associated with row line 91 in array 20B and row line 97 in array 20D, and that the column addressed is again that of circuit 71 shown in FIG. 3. Again RAS* and CAS* go low and initiate the output of the addresses on buffers 44 and 45, and, shortly after RAS* goes low, EQ goes low disabling precharge circuits 40A, 41A, 42A, and 43A. Then ISOC goes low, turning off transistors 79A, 79B, 80A, and 80B thus isolating column line halves 70A and 72A from column line halves 70B and 72B, respectively, and also from N-sense amplifier 32A and P-sense amplifier 36A, and also isolating column line halves 74A and 76A from column line halves 74B and 76B, respectively, and also from N-sense amplifier 33A and P-sense amplifier 37A. Next the row lines 91 and 97 begin to go high turning on the transistors in cells 18A and 18H, respectively, placing the signals in the cells on column line halves 72B and 76B, respectively. NLAT then goes high, turning on the N-sense amplifiers 32A and 33A which drives the lower of the column line halves to which they are connected to logic 0. Then, ISOC goes high again, turning on transistors 79A, 79B, 80A, and 80B thus reconnecting column line halves 70A and 72A to column line halves 70B and 72B, respectively, and also to N-sense amplifier 32A and P-sense amplifier 36A, and also reconnecting column line halves 74A and 76A to column line halves 74B and 76B, respectively, and also to N-sense amplifier 33A and P-sense amplifier 37A. Then PSNFC* and PSNFP* go low, turning on P-sense amplifiers 38A and 39A, and 36A and 37A, respectively, which pulls up the high one of the column line halves to which they are connected to logic 1, or as near thereto as possible. Meanwhile, responding to the address on lines 46 (FIG. 1), column decoder 14 connects the column line pairs at the address output from column address buffer 44 to the data input/output lines 62 (FIG. 1); namely column lines 70 and 72 are connected to one pair of input/output lines 62 (FIG. 1) and the column lines 74 and 76 are connected to another pair of the input/output lines 62, which sends the logic signals stored in cells 18C and 18E to the data output 56. Then RAS* returns high causing row lines 91 and 97 to go low turning off the transistors of cells 18A and 18H respectively, preventing the capacitors of the respective cells from being affected by subsequent voltages on column line halves 72B and 76B respectively. NLAT then returns low and PSNFC* and PSNFP* return high, shutting off N-sense amplifiers 32A and 33A and P-sense amplifiers 38A and 39A and 36A and 37A, respectively. Finally, EQ returns high enabling precharge circuits 40A, 41A, 42A, and 43A which connect column line 70 to column line 72 and column line 74 to column line 76 respectively, which causes them to charge to an intermediate level between logic 1 and logic 0.

Comparing FIGS. 4 and 5, it is seen that the timing signals of the invention differ from the timing signals of the prior art in that there is an additional P-sense amplifier signal and that, in the A8 high access, ISOP stays low right through the firing of the P-sense amplifier. Moreover, only one of the P-sense amplifiers associated with each column line pair fires during this cycle. Thus, in the invention, referring to the top half of FIG. 3, the N-sense amplifier 32A and P-sense amplifier 38A remain isolated from the column line halves 70B and 72B throughout the amplification cycle and only the column line halves 70A and 72A are charged. Likewise, referring to the bottom half of FIG. 3, on the same cycle, only the column line halves 74A and 76A are charged. In the other part of the cycle shown in FIG. 5, when A8 is low, all four of the P-sense amplifiers 36A, 37A, 38A, and 39A fire and the entire column lines 70, 72, 74, and 76 are charged. Thus, as compared to the prior art, in DRAM access, the integrated circuit of the invention will save 50% of the power 50% of the time. In write mode the timing will be similar, except all the P sense amplifiers will be disabled for a short period of time to allow overwrite of the column pairs, and the column line connection to the input/output lines 54 and 56 will vary as is known in the art, allowing the input signal to flip the column lines and the cells being addressed to the input logic level. Again in the A8 high accesses the column line halves 70B, 72B, 74B, and 76B on the SAM side will be isolated from the column line halves 70A, 72A, 74A, and 76A respectively on the column decoder side until into the precharge portion of the cycle, thus saving 50% of the power 50% of the time.

Figure 6:
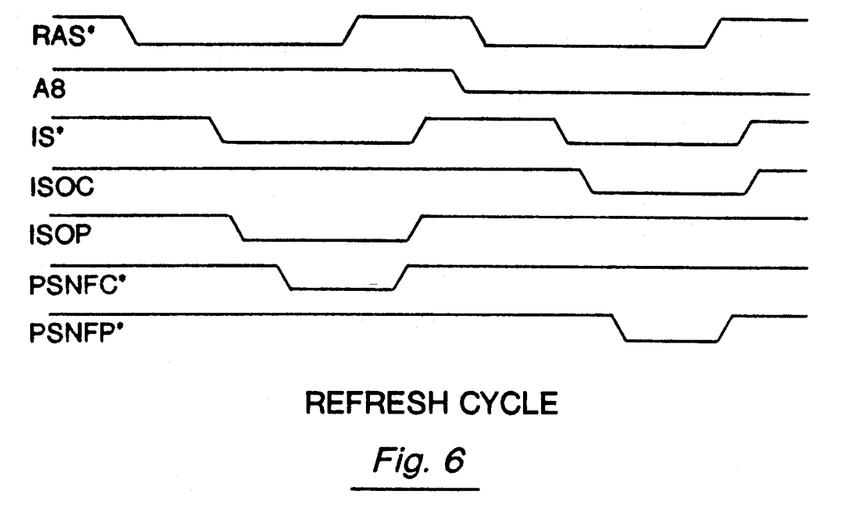
FIG. 6 is a timing diagram showing the cycles of timing signals utilized in the refresh function for the integrated circuit of FIG. 3.

FIG. 6 is a timing diagram of the circuit 71 of FIG. 3 during a typical refresh cycle. The refresh period, as is known in the art is, a cycle initiated by the RAS* signal dropping after the CAS* signal drops, commonly called CAS before RAS refresh (CBR). This period may be controlled from outside the chip 10 or on board the chip 10. In either case the timing generator means 50 provides the appropriate RAS* and CAS* signals. As seen from the figures, in both the A8 high mode and A8 low mode the return of both the ISOC and ISOP to high is delayed until after the P-sense amplifier cycle. Thus the column line halves not associated with the row being refreshed are isolated from the column line halves associated with the row being refreshed through the entire refresh amplification cycle. Also, only the P-sense amplifiers associated with the row being refreshed are fired. Thus 50% of the power is saved in 100% of the refresh cycles.

Figure 7:
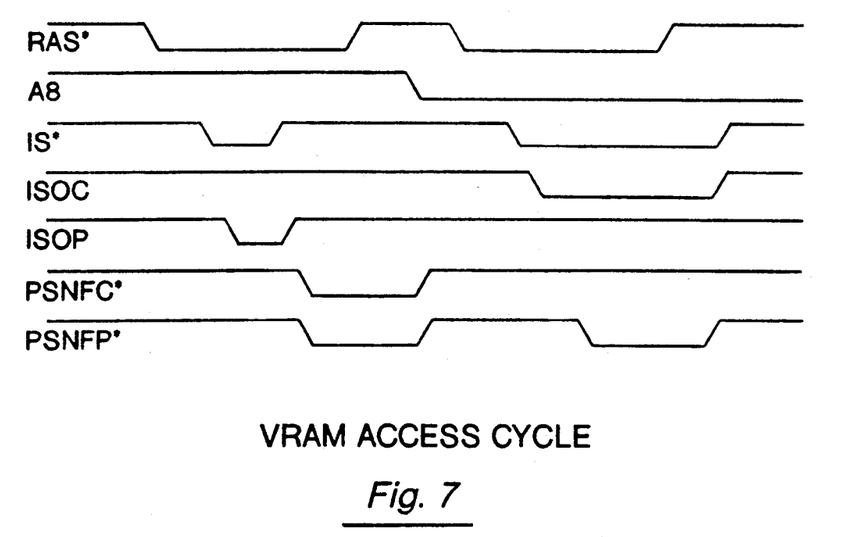
FIG. 7 is a timing diagram showing the cycles of timing signals utilized in a VRAM access for the integrated circuit of FIG. 3.

FIG. 7 is a timing diagram showing the VRAM access cycles. For example, Read Transfer, Split Read Transfer, Write Transfer, Marked Write Transfer, and Flash Write, in this particular implementation. In this mode the timing of ISOC and ISOP are interchanged as is the timing of PSNFC* and PSNFP*. During the access of arrays 20B and 20D (A8 low), isolator transistors 79A, 79B, 80A, and 80B are held off until through the P-sense cycle and into the precharge cycle, and P-sense amplifiers 38A and 39A are not fired. Thus the column line halves 70A, 72A, 74A, and 76A are not charged in these accesses, because these VRAM modes deal exclusively with the SAM side column halves, and this mode also saves 50% of the energy 50% of the time.

5. The Single P-sense Amplifier Architecture

Figure 8:
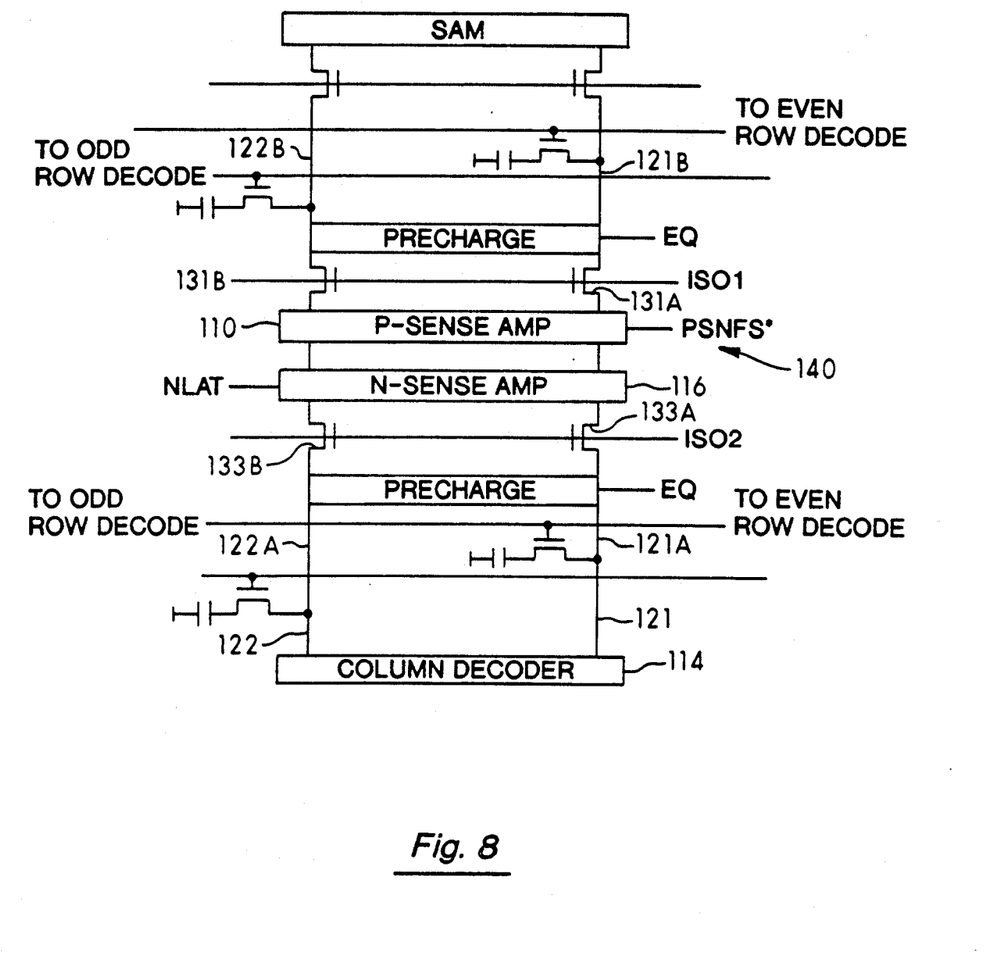
FIG. 8 is a circuit diagram illustrating the electronic architecture of an array according to another preferred embodiment of the invention.

FIG. 8 illustrates an alternative embodiment of the invention that also provides the advantages of power savings of 50% of the power 50% of the time. This circuit 108 is the same as half of the circuit 71 in FIG. 3 except that there is only one P-sense amplifier associated with each column line pair: P-sense amplifier 110 connected across column lines 121 and 122. P-sense amplifier 110 is located adjacent N-sense amplifier 116. As mentioned above, this P-sense architecture will provide the 50% power savings 50% of the time. Thus, the timing signals are as shown in FIGS. 5, 6, and 7, except there is no need for the separate PSNFC* and PSNFP* signals: these signals can be combined to form the single P-sense amplifier signal, PSNFS*, which is similar to PSNF* in FIG. 4. This embodiment requires only half the P-sense amplifiers of the embodiment of FIG. 3 and has all the other advantages of that embodiment, except that the P-sense amplifier 110 must pull up each of column line halves 121A, 122A, 121B, and 122B through an isolation transistor 133A, 133B, 131A, and 131B, respectively. Thus the isolation transistors 133A, 133B, 131A, and 131B should preferably be low threshold transistors requiring the extra mask process in fabrication. Further, as compared to the prior art, this embodiment has the advantage of pulling up both column line pair halves to the same voltage, thus resulting in smoother voltage and power curves.

A feature of the invention is that novel P-sense architectures, i.e. the addition of a second P-sense amplifier to each column line pair in a memory array or alternatively the location of a single P-sense amplifier adjacent the N-sense amplifier between the isolation means, yields many immediate advantages and also leads to additional advantages when combined with new extended isolation timing designs.

A further feature of the invention is that a timing design which, during an access of the column line halves nearest the data port, continues the isolation of the amplifier from the column line halves distal from the data port through the P-sense amplifier cycle and into the precharge cycle, yields power saving advantages by itself, and also yields further advantages in combination with the novel P-sense amplifier architectures. A related feature of the inventions that the advantages of the novel timing designs will ensue with any amplifier means 140 (FIG. 14), including just an N-sense amplifier, 116, a P-sense amplifier 110, both, any of the other amplifier combinations shown in the other embodiments, as well as other amplifiers used in the art.

There has been described a novel memory array circuit which saves power, and which has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be advantageous to use the extended isolation period with the dual P-sense amplifier architecture and the single P-sense amplifier adjacent the N-sense amplifier architecture, it becomes clear that other designs incorporating the extended isolation feature can be useful. The invention may also be used in other types of memory than those described. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the integrated circuit memory described.

What is claimed is:

1. An integrated circuit memory comprising:
   an array of memory cells arranged in a plurality of rows and at least one column;
   a plurality of row lines, each row line connecting cells in a row;
   row decoder means for addressing one of said rows in response to a row address signal;
   a column line connecting cells in a column, said column line divided into a first portion and a second portion;
   timing signal generator means for providing a P-sense timing signal defining a P-sense period and an isolation timing signal defining an isolation period which begins prior to the beginning of said P-sense period and extends into said P-sense period, said isolation timing signal being related to whether the row being addressed by said row decoder means is connected to a cell connected to said first column line portion or a cell connected to said second column line portion;
   P-sense amplifier means connected to said column line and responsive to said P-sense timing signal for amplifying the signal on said column line during said P-sense period; and
   isolating means responsive to said isolation timing signal for isolating said first column line portion from said second column line portion and said P-sense amplifier means during said isolation period while a row line associated with said second column line portion is being addressed.

2. An integrated circuit memory as in claim 1 further comprising input/output means for connecting said second column line portion to a circuit external of said memory array and wherein:
   said P-sense timing signal comprises a first P-sense timing signal defining a first P-sense period and a second P-sense timing signal defining a second P-sense period;
   said P-sense amplifier means comprises first P-sense amplifier means connected to said first column line portion and responsive to said first P-sense timing signal for amplifying the signal on said first column line portion during said first P-sense period and second P-sense amplifier means connected to said second column line portion and responsive to said P-sense timing signal for amplifying the signal on said second column line portion during said second P-sense period; and
   said isolating means comprises first isolating means responsive to said isolation timing signal for isolating said first column line portion from said second column line portion and said second P-sense amplifier means during said first P-sense period while a row line associated with said second column line portion is being addressed.

3. An integrated circuit memory as in claim 1 wherein:
said P-sense timing signal comprises a first P-sense timing signal defining a first P-sense period and a second P-sense timing signal defining a second P-sense period;
said timing signal generator means further comprises means for providing a refresh timing signal defining a refresh period; and
said isolating means comprises first isolating means responsive to said isolation timing signal for isolating said first column line portion from said second column line portion and said P-sense amplifier means during said second P-sense period while a row line associated with said second column line portion is being addressed during said refresh period, and second isolating means responsive to said isolation timing signal for isolating said second column line portion from said first column line portion and said P-sense amplifier means during said first P-sense period while a row line associated with said first column line portion is being addressed during said refresh period.

4. An integrated circuit memory as in claim 3 and further comprising an N-sense amplifier connected to said column line between said first isolating means and said second isolating means and wherein said P-sense amplifier means comprises first P-sense amplifier means connected to said first column line portion and responsive to said first P-sense timing signal for amplifying the signal on said first column line portion during said first P-sense period, and second P-sense amplifier means connected to said second column line portion and responsive to said second P-sense timing signal for amplifying the signal on said second column line portion during said second P-sense period.

5. An integrated circuit memory as in claim 1 wherein said timing signal generator means further comprises means for producing a row access signal which changes during said P-sense period, and said isolation period continues at least until said row access signal changes during said P-sense period.

6. An integrated circuit memory as in claim 5 wherein said timing signal generator means further comprises means for producing a signal defining a precharge period, and said isolation period continues at least until said precharge period.

7. An integrated circuit memory as in claim 6 wherein said isolation period extends into said precharge period.

8. An integrated circuit memory as in claim 1 and further comprising an N-sense amplifier, and wherein:
said timing signal generator means further comprises means for providing an N-sense timing signal defining a N-sense period;
said isolating means comprises first isolating means responsive to said isolation timing signal for isolating said first column line portion from said second column line portion, said N-sense amplifier, and said P-sense amplifier means during said P-sense period while a row line associated with said second column line portion is being addressed, and second isolating means responsive to said isolation timing signal for isolating said second column line portion from said first column line portion and said N-sense amplifier during said N-sense amplifier period while a row line associated with said first column line portion is being addressed; and
said N-sense amplifier is connected to said column line between said first isolating means and said second isolating means.

9. An integrated circuit as in claim 8 wherein said P-sense amplifier means comprises a P-sense amplifier connected to said column line between said first isolating means and said second isolating means.

10. An integrated circuit memory as in claim 9 wherein there are a plurality of said column lines, each column line is divided into a first portion and a second portion, and each column line has associated with it one of said N-sense amplifiers, one of said first isolating means, one of said second isolating means, and one of said P-sense amplifiers.

11. An integrated circuit memory comprising:
an array of memory cells arranged in a plurality of rows and at least one column;
a plurality of row lines, each row line connecting cells in a row;
row decoder means for addressing one of said rows in response to a row address signal;
a column line connecting cells in a column, said column line divided into a first portion and a second portion;
input/output means for connecting said first column line portion to a circuit external of said memory array;
timing signal generator means for providing a first P-sense timing signal defining a first P-sense period, a second P-sense timing signal defining a second P-sense period, and an isolation timing signal related to whether the row being addressed by said row decoder means is connected to a cell connected to said first column line portion or a cell connected to said second column line portion;
first P-sense amplifier means responsive to said first P-sense timing signal for amplifying the signal on said first column line portion during said first P-sense period;
second P-sense amplifier comprises means responsive to said P-sense timing signal for amplifying the signal on said second column line portion during said second P-sense period;
isolating means responsive to said isolation timing signal for isolating said second column line portion from said first column line portion and said first P-sense amplifier during said first P-sense period while a row line associated with said first column line portion is being addressed.

12. An integrated circuit memory as in claim 11 and further comprising an N-sense amplifier connected to said column line between said first isolating means and said second isolating means, and wherein:
said timing signal generator means further comprises means for providing a refresh timing signal defining a refresh period;
said isolating means comprises first isolating means responsive to said isolation timing signal for isolating said first column line portion from said second column line portion, said N-sense amplifier, and said second P-sense amplifier means during said second P-sense period while a row line associated with said second column line portion is being addressed during said refresh period; and
second isolating means responsive to said isolation timing signal for isolating said second column line portion from said first column line portion, said N-sense amplifier, and said first P-sense amplifier means during said first P-sense period while a row line associated with said first column line portion is being addressed during said refresh period.

13. An integrated circuit memory comprising:
an array of memory cells arranged in a plurality of rows and columns;
a plurality of row lines, each row line connecting cells in a row;
row decoder means for addressing one of said rows in response to a row address signal;
a first column line pair comprising a first column line connecting cells in one column and a second column line connecting cells in an adjacent column, said first column line pair divided into a first pair of column line halves and a second pair of column line halves;
timing signal generator means for providing a P-sense timing signal defining a P-sense period and an isolation timing signal related to whether the row being addressed by said row decoder means is connected to a cell connected to said first pair of column line halves or a cell connected to said second pair of column line halves;
P-sense amplifier means connected between said column line pair and responsive to said P-sense timing signal for amplifying the signal on said column line pair during said P-sense period; and
isolating means responsive to said isolation timing signal for isolating said first pair of column line halves from said second pair of column line halves and said P-sense amplifier means during said P-sense period while a row line associated with said second pair of column line halves is being addressed.

14. An integrated circuit memory as in claim 13 further comprising DRAM input/output means for connecting said second pair of column line halves to a circuit external of said memory array and wherein:
said P-sense timing signal comprises a first P-sense timing signal defining a first P-sense period and a second P-sense timing signal defining a second P-sense period;
said P-sense amplifier means comprises first P-sense amplifier means connected to said first pair of column line halves and responsive to said first P-sense timing signal for amplifying the signal on said first pair of column line halves during said first P-sense period and second P-sense amplifier means connected to said second pair of column line halves and responsive to said P-sense timing signal for amplifying the signal on said second pair of column line halves during said second P-sense period;
said isolating means comprises first isolating means responsive to said isolation timing signal for isolating said first pair of column line halves from said second pair of column line halves and said second P-sense amplifier means during said first P-sense period while a row line associated with said second pair of column line halves is being addressed.

15. An integrated circuit memory as in claim 14 further comprising VRAM input/output means for connecting said first pair of column line halves to a circuit external of said memory array and wherein said isolating means further comprises second isolating means responsive to said isolation timing signal for isolating said second pair of column line halves from said first pair of column line halves and said first P-sense amplifier means during said first P-sense period while a row line associated with said first column line portion is being addressed.

16. An integrated circuit memory as in claim 15 wherein:
said timing signal generator means further comprises means for providing a refresh timing signal defining a refresh period;
said first isolating means comprises means responsive to said isolation timing signal for isolating said first pair of column line halves from said second pair of column line halves and said second P-sense amplifier means during said second P-sense period while a row line associated with said second pair of column line halves is being addressed during said refresh period; and
said second isolating means comprises means responsive to said isolation timing signal for isolating said second pair of column line halves from said first pair column line halves and said first P-sense amplifier means during said first P-sense period while a row line associated with said first pair of column line halves is being addressed during said refresh period.

17. An integrated circuit memory as in claim 16 and further comprising an N-sense amplifier connected across said column line pair between said first isolating means and said second isolating means.

18. An integrated circuit memory as in claim 17 wherein there are a plurality of said column line pairs, each column line pair is divided into a first pair of column line halves and a second pair of column line halves, and each column line pair has associated with it one of said N-sense amplifiers, one of said first isolating means, one of said second isolating means, one of said first P-sense amplifier means, and one of said second P-sense amplifier means.

19. An integrated circuit memory as in claim 13 and further comprising an N-sense amplifier, and wherein:
said timing signal generator means further comprises means for providing an N-sense timing signal defining a N-sense period;
said isolating means comprises first isolating means responsive to said isolation timing signal for isolating said first pair of column line halves from said second pair of column line halves, said N-sense amplifier. and said P-sense amplifier means during said P-sense period while a row line associated with said second pair of column line halves is being addressed, and second isolating means responsive to said isolation timing signal for isolating said second pair of column line halves from said first pair of column line halves and said N-sense amplifier during said N-sense amplifier period while a row line associated with said first pair of column line halves is being addressed;
said N-sense amplifier is connected to said column line pair between said first isolating means and said second isolating means; and
said P-sense amplifier means comprises a P-sense amplifier connected to said column line pair between said first isolating means and said second isolating means.

20. An integrated circuit memory comprising:
an array of memory cells arranged in a plurality of rows and at least one column;
a plurality of row lines, each row line connecting cells in a row;

row decoder means for addressing one of said rows in response to a row address signal;

a column line connecting cells in a column, said column line divided into a first portion and a second portion;

an amplifier;

timing signal generator means for providing a row access signal which changes near the beginning of an access cycle accessing one or more of said cells and then returns to its original value later in said access cycle, and amplifier signal defining an amplifying period, and an isolation timing signal defining an isolation period, said isolation timing signal being related to whether the row being addressed by said row decoder means is connected to a cell connected to said first column line portion or a cell connected to said second column line portion, and said isolation period beginning prior to said amplifying period and continuing at least until said row access signal returns to its original value;

isolating means responsive to said isolation timing signal for isolating said first column line portion from said second column line portion and said amplifier during said isolation period while a row line associated with said second column line portion is being addressed.

21. An integrated circuit memory as in claim 20 wherein said timing signal generator means further comprises means for producing a signal defining a precharge period, and said isolation period continues at least until said precharge period.

22. An integrated circuit memory as in claim 21 wherein said isolation period extends into said precharge period.

* * * * *